United States Patent [19]
Baba et al.

[11] Patent Number: 5,321,289
[45] Date of Patent: Jun. 14, 1994

[54] VERTICAL MOSFET HAVING TRENCH COVERED WITH MULTILAYER GATE FILM

[75] Inventors: Yoshiro Baba, Yokohama; Satoshi Yanagiya; Noburo Matsuda, both of Kawasaki; Shunichi Hiraki, Nagareyama, all of Japan

[73] Assignee: Kabushiki Kaisha Toshiba, Kawasaki, Japan

[21] Appl. No.: 139,142

[22] Filed: Oct. 21, 1993

[30] Foreign Application Priority Data

Oct. 22, 1992 [JP] Japan ................................. 4-284338

[51] Int. Cl.⁵ ...................... H01L 29/78; H01L 29/10
[52] U.S. Cl. ........................ 257/331; 257/334
[58] Field of Search ........................ 257/330–334

[56] References Cited

U.S. PATENT DOCUMENTS

| | | | |
|---|---|---|---|
| 4,893,160 | 1/1990 | Blanchard | 257/334 |
| 4,914,058 | 4/1990 | Blanchard | 257/333 |
| 5,034,785 | 7/1991 | Blanchard | 257/351 |

*Primary Examiner*—Gene M. Munson
*Attorney, Agent, or Firm*—Finnegan, Henderson Farabow, Garrett & Dunner

[57] ABSTRACT

A vertical MOSFET includes a trench whose inner surface is covered with an insulating layer having a multilayer structure. In order to reduce a change in a gate threshold voltage, and equivalent silicon dioxide thickness of the gate insulating layer and a radius of curvature of an upper corner of the trench are provided such that a dielectric breakdown electric field strength of the gate insulating layer at the upper corner is in the range of 2.5 MV/cm to 5.0 MV/cm.

6 Claims, 5 Drawing Sheets

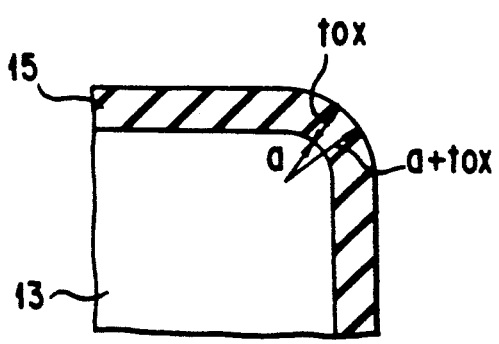
F I G. 2
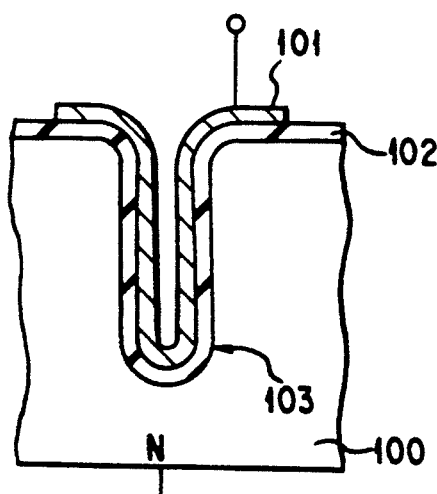
F I G. 3
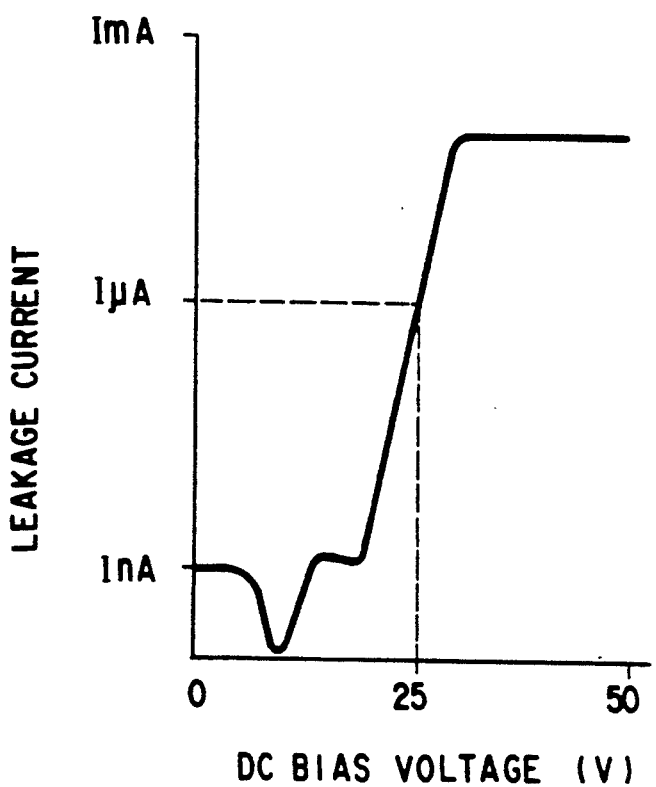
F I G. 4

VERTICAL MOSFET HAVING TRENCH COVERED WITH MULTILAYER GATE FILM

BACKGROUND OF THE INVENTION

1. Field of the Invention

The present invention relates to a semiconductor device such as insulated gate field effect transistors (MOSFETs) or MOS integrated circuits including MOSFETs, and more specifically, to a vertical MOSFET which has a trench structure with a U-shaped cross section.

2. Description of the Related Art

Recently, there has been developed vertical MOSFETs having a trench structure capable of more reducing the cell size.

FIG. 7 shows a cross section of a trench structure of a conventional N-channel vertical MOSFET.

In this figure, reference numeral 10 denotes an N+-type semiconductor substrate, 11 an N-type epitaxial layer, 12 a P-type layer for providing a channel, 13 an N+-type source region, and 14 a U-shaped trench extending from the surface of the source region 13 through a portion of the P-type layer 12 to reach the epitaxial layer 11, respectively.

Further, reference numeral 15 denotes a gate insulation film formed on the inner wall of the trench 14, and 16 denotes a polysilicon gate electrode formed on the gate insulation film 15 so as to fill the trench 14.

Since the vertical MOSFET has the gate electrode 16 provided in the trench 14, the cell size can be reduced, and the on-resistance can be also lowered.

The operating principle of the N-channel vertical MOSFET will now be explained.

The source region 13 is grounded, and a positive voltage is applied to the semiconductor substrate 10 (drain region) and the gate electrode 16. In this case, as the gate voltage is increased, a side surface region of the P-type layer 12, which is opposed to the gate electrode 16, is inverted to provide an inversion layer (channel region). Hence, electrons flow from the source region 13 to the drain region (epitaxial layer 11 and semiconductor substrate 10) located directly underneath the inversion layer.

However, when the vertical MOSFET is actually manufactured, it has disadvantages in its characteristics. That is, unwanted phenomena would occur such that the film thickness and film quality of the gate insulation film 15 at the upper corner of the trench 14 are different from those at another portion. As a result, the threshold voltage $V_{th}$ and the output characteristics ($I_{ds}$, $g_m$) at the upper corner may be different from that at another portions, resulting in unbalanced characteristics.

For preventing the disadvantage in the gate insulation film 15 at the side surface of the trench 14, it has been considered to smoothly round the upper corner of the gate insulation film 15, or improve the quality of the gate insulation film 15 formed in the inner wall of the trench 14.

In order to enhance the thermal stress of the gate insulation film, the bias stress, and the long life reliability, a multilayer (composite) gate film having an O (oxide)/N (nitride)/O (oxide) structure, which is composed of a thermal oxide film, a nitride film, and a CVD oxide film, has been used as a trench capacitor employed in 4MDRAMs (4M-bit dynamic semiconductor memory). It has been known that the dielectric breakdown electric field strength of the trench capacitor depends generally on both the radius of curvature (rounding amount) of the upper corner of the trench, and the equivalent silicon dioxide thickness of the composite gate film.

FIG. 8 shows the calculation results of the dependence of the dielectric breakdown electric field strength of the trench capacitor on the gate oxide film thickness in the case where the radius of curvature of the upper corner of the trench is 100 Å (10 nm) and 400 Å (40 nm). (The calculations were carried out with the assumption that an intrinsic breakdown electric field strength of the oxide film is given by 8 MV/cm.)

As for the trench capacitor in the 4MDRAM, a large capacity and a high dielectric breakdown electric field strength are required. Therefore, it is necessary that a thin gate film having a thickness of 15 nm or less have a dielectric breakdown electric field strength of 7 MV/cm or higher.

In fact, it is reported that the breakdown electric field strength of the trench capacitor of the 4MDRAM is 7 MV/cm or higher, which coincides with the results of the above calculation in the case where the radius of curvature a of the composite gate film of the upper corner of the trench is 15 nm, and the intrinsic breakdown electric field strength of the O/N/O composite gate film is 10 MV/cm.

As for the vertical MOSFET, when the guaranteed value of the gate breakdown voltage and the gate threshold voltage are given by 20 V and 1.0 V–2.0 V, respectively, as its specifications, it is required that the equivalent silicon dioxide thickness is limited to 50–65 nm, and the change in the gate threshold voltage does not occur.

It may be considered that the composite gate film having an O/N/O structure described above is employed as the gate insulation film formed on the inner wall of the trench 14.

However, since a MOSFET having the composite gate film has a problem such that the threshold voltage of the gate varies at an electric field of 6 MV/cm or more, the composite gate film is not employed as the gate insulation film of the inner wall of the trench 14 of the vertical MOSFET.

As described above, the change in the gate threshold voltage occurs at the electric field of 6 MV/cm or higher in the trench type MOSFET using the composite gate film. The followings show results to prove the fact described above by forming a capacitor having a flat gate structure as an evaluation sample.

FIG. 9 shows a cross section of the capacitor having the flat gate structure formed as the evaluation sample.

This figure illustrates an N-type semiconductor substrate 100, a plate electrode 101, and a composite gate film 103 having an O/N/O structure whose equivalent silicon dioxide thickness $t_{ox}$ is given by 50 nm.

FIG. 10 shows the leakage current of the gate film 102 when the DC bias voltage is applied between the plate electrode 101 of the capacitor having the flat gate structure shown in FIG. 9, and the semiconductor substrate 100. In this case, the leakage current value is given by the gate area per 0.1 cm².

FIG. 11 shows a relationship between a DC bias application time and a variation in a flat band voltage $V_{FB}$ in the case where a voltage applied to capacitor of FIG. 10, is +30 V or '30 V (equivalent to the breakdown electric field strength of 6 MV/cm), and in the case where the applied voltage is +40 V or −40 V (equivalent to the breakdown electric field strength of 8 MV/cm).

It can be understood from FIGS. 10 and 11 that when leakage current flowing through the gate film exceeds 1 μA at the applied voltage of 40 V, carriers are trapped in the interface between films of the composite gate structure, resulting in a variation in flat-band voltage $V_{FB}$ due to the film interface electric field.

This means that when the gate structure is applied to the MOSFET and the electric field of 6 MV/cm or more is applied thereto, the variation in the threshold voltage of the gate of the MOSFET occurs.

At any rate, in the conventional vertical MOSFET, when the composite gate film having the 0/N/0 structure is adopted in order to improve the thermal stress, the bias stress, and the long life reliability of the gate insulation film, the variation in the threshold voltage of the gate would occur at an electric field of 6 MV/cm or more.

SUMMARY OF THE INVENTION

Therefore, an object of the present invention is to provide a vertical MOSFET having stable characteristics and a high reliability.

Another object of the invention is to provide a vertical MOSFET having no variation in gate threshold voltage.

Further object of the invention is to provide a vertical MOSFET having improved thermal and bias stresses of the gate insulation film.

According to one aspect of the present invention, there is provided a vertical MOSFET, which comprises a semiconductor substrate of a first conductivity type including a first semiconductor layer of the first conductivity type, a second semiconductor layer of a second conductivity type formed in the first semiconductor layer to provide a channel, a third semiconductor layer of the first conductivity type formed in the second semiconductor layer, a trench formed in the third semiconductor layer down to the first semiconductor layer, a gate insulating layer having a multilayer structure and covering a surface of the trench, and a gate electrode layer provided on the gate insulating layer so as to fill the trench therewith. In the structure, an equivalent silicon dioxide thickness of the gate insulating layer and a radius of curvature of an upper corner of the trench are provided so that a dielectric breakdown electric field strength of the gate insulating layer at the upper corner is in the range of 2.5 MV/cm to 5.0 MV/cm.

BRIEF DESCRIPTION OF THE DRAWINGS

The novel and distinctive features of the invention are set forth in the claims appended to the present application. The invention itself, however, together with further objects and advantages thereof may best be understood by reference to the following description and accompanying drawings in which

FIG. 2 is an enlarged cross-sectional view showing an upper corner A of a trench in FIG. 1B;

FIG. 3 is a cross-sectional view showing a capacitor having a trench structure and formed as an evaluation sample of present invention;

FIG. 4 is a graph showing a leakage current characteristic of the gate film of the capacitor in FIG. 3;

DETAILED DESCRIPTION OF THE PREFERRED EMBODIMENTS

An embodiment of the present invention will be described with reference to FIGS. 1A to FIG. 2.

Figure 1A:
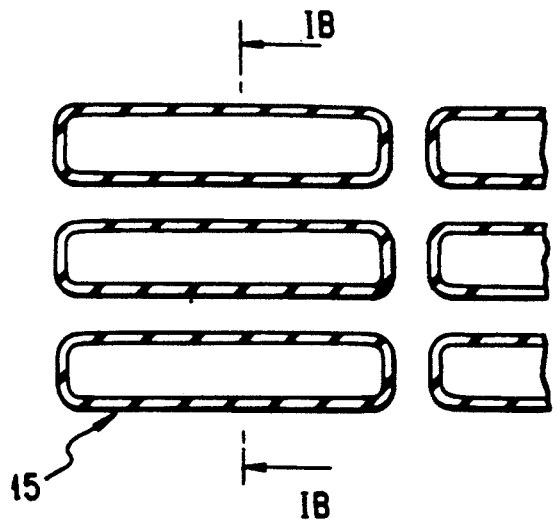
FIG. 1A is a plan view showing a pattern of trenches in a vertical MOSFET according to an embodiment of the present invention.

FIG. 1A shows a plane pattern of trenches within a part of a region (including a plurality of cell regions) of a vertical MOSFET formed in a discrete semiconductor device or a MOS integrated circuit.

Figure 1B:
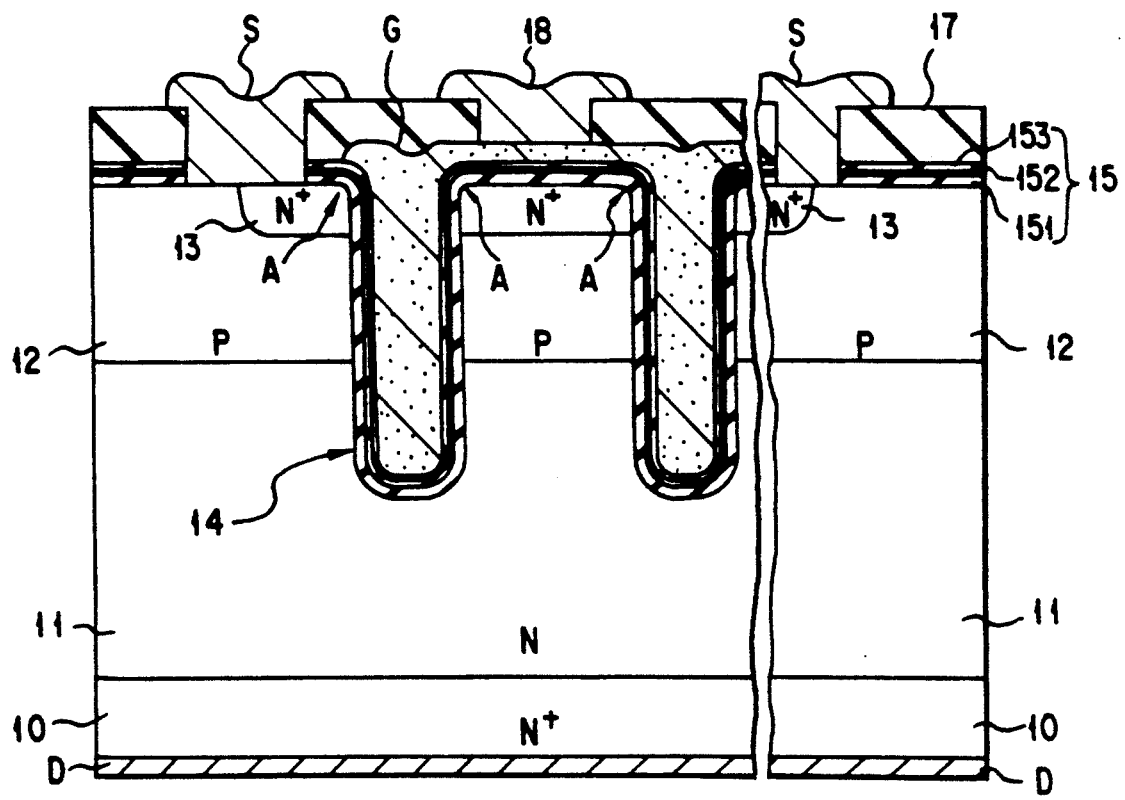
FIG. 1B is a cross-sectional view showing the vertical MOSFET taken along a line IB—IB of FIG. 1A.

In FIGS. 1A to 2, reference numeral 10 denotes an N+-type semiconductor substrate, 11 an N-type first semiconductor layer (epitaxial layer) serving as a drain region, which has a low impurity concentration and is formed on the semiconductor substrate 10, and 12 a P-type second semiconductor layer for forming a channel, provided on the upper surface of the epitaxial layer 11 by diffusion.

Further, reference numeral 13 denotes a plurality of N+-type third semiconductor layers each serving as a source region (the width of the source region is, for example, 18 μm), which are arranged in parallel with one another, and 14 denotes U-shaped trenches (the width of, for example, 1 μm, the depth of, for example, 4 μm), having a lattice-shaped plane pattern (the space of, for example, 3 μm) and extending from the surface of the third semiconductor layer 13 through the second semiconductor layer 12 to reach the epitaxial layer 11.

The source regions 13 are separated by the trenches 14 to provide a plurality of unit cells each having a substantially rectangular and plane pattern, and the unit cells are regularly arranged in the vertical and horizontal directions.

Numeral 15 denotes a gate insulation layer with a multilayer structure provided on the inner wall of the trench 14, and the gate insulation layer has the 0/N/0 structure composed of a thermal oxide film 151, a nitride film 152, and a CVD oxide film 153.

G denotes a gate electrode provided so as to fill the trenches 14. The gate electrode G is composed of, for example, a doped polysilicon. Numeral 17 denotes an insulation layer which covers the exposed portions of the gate electrode G, the source regions 13 and the composite gate layer 15.

Numeral 18 denotes a gate wiring layer electrically connected to the gate electrode G via a contact hole provided in the insulation layer 17.

S denotes a source electrode (wiring layer) connected to each of the source region 13 via a contact hole formed in the insulation layer 17. In this case, the source electrode S is electrically connected to the second semiconductor layer 12 in common. Therefore, an unwanted parasitic NPN transistor provided by the drain region, the second semiconductor region, and the source region can be prevented.

D denotes a drain electrode attached to the opposite surface of the semiconductor substrate 10.

The source electrode S and the drain electrode D are formed integrally with each cell, and the gate electrodes of the cells are commonly connected to one another by means of the gate wiring layer 18. Thus, the cells are connected in parallel.

The operation principle of the N-channel vertical MOSFET is similar to that of the conventional type. That is, the source region S is grounded, and a positive voltage is applied to the drain electrode D and the gate electrode G. In this case, as the gate voltage is increased, a trench side region (channel portion) of the second semiconductor layer 12, which is opposed to the gate electrode G, is inverted into an N-type region to provide an inversion layer, and thus electrons flow from the source region 13 to the epitaxial layer 11 region located directly underneath the inversion layer.

In the embodiment, as shown in FIG. 2, the radius of curvature a of the upper corner A of the trench, and the equivalent silicon dioxide thickness $t_{ox}$ of the gate insulation layer 15 are set so as to have a desired relationship. That is, the breakdown electric field strength of a portion of the gate insulation layer 15 located at the upper corner of the trench is set within a range of 2.5 MV/cm to 5.0 MV/cm.

More specifically, the dielectric flux $\phi(r)$ at the center portion of the gate insulation layer can be expressed by $$\phi(r) = -[V_G/ln\{1+(t_{ox}/a)\}] \cdot ln(a/r)$$

where r represents a radius of curvature of the center portion of the gate insulation layer 15 at the upper corner of the trench, and $V_G$ represents a voltage applied between both terminals of the gate insulation layer 15.

Further, the vector expression of the electric field E (r) at the center portion of the gate insulation layer is given by $$E(r) = -[V_G/r \cdot ln\{1+(t_{ox}/a)\}] \cdot i_r$$

The dielectric breakdown electric field strength Emax of the gate insulation layer 15 located at the upper corner of the trench is the absolute value of the above equation in the case of r=a. Therefore, Emax is given by $$Emax = V_G/a \cdot ln\{1+(t_{ox}/a)\}.$$

When the intrinsic breakdown voltage of the gate insulation layer 15 is expressed by Eo, the above equation can be rewritten as:

$$Emax = (Eo/t_{ox} \cdot a) \cdot ln\{1+(t_{ox}/a)\}$$

In the case of Eo=8 MV/cm, $t_{ox}/a$ is set to $1.4 \leq t_{ox}/a \leq 6.0$ in order to satisfy 2.5 Mv/cm $\leq$ Emax $\leq$ 5.0 MV/cm.

Figure 9:
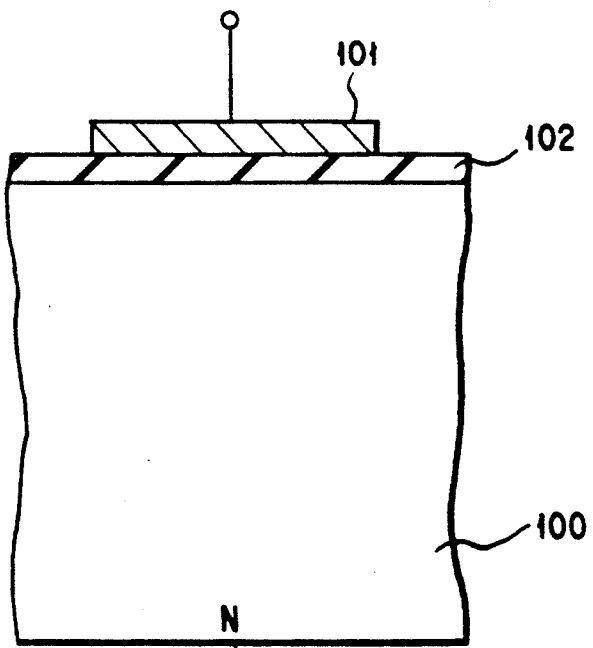
FIG. 9 is a cross-sectional view showing a capacitor having a flat gate structure and formed as an evaluation sample for comparing with the present invention.
Figure 10:
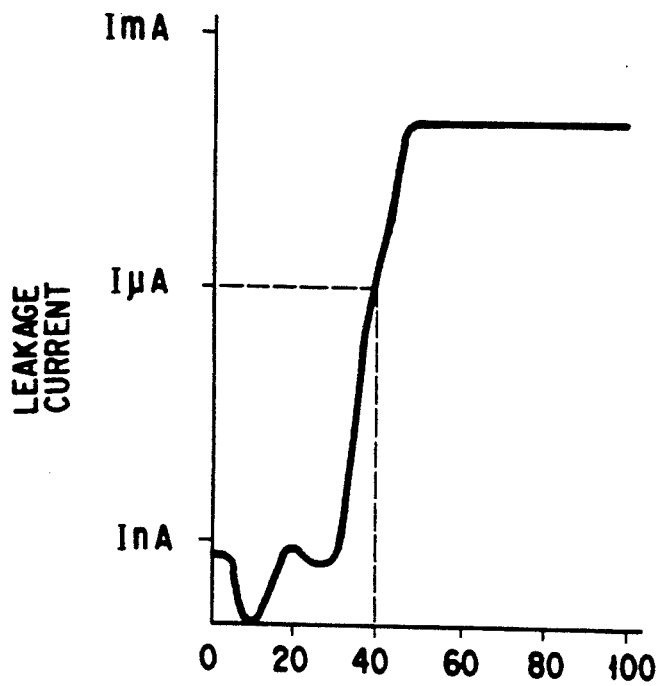
FIG. 10 is a graph showing a leakage characteristic of the gate film of the capacitor having the flat gate structure in FIG. 9.
Figure 11:
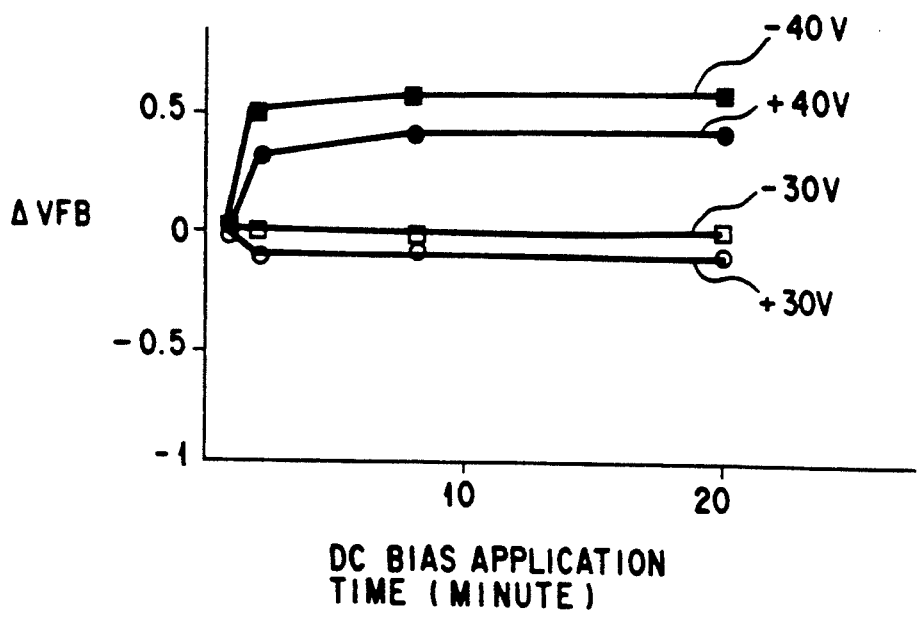
FIG. 11 is a graph showing a relationship between a DC bias application time of the capacitor and a variation in flat-band voltage VFB shown in FIG. 9.

FIG. 3 is a cross section of a capacitor having a trench structure, which is formed as an evaluation sample for the present invention, and formed at the same time on the same semiconductor chip having the evaluation capacitor with the flat gate structure shown in FIG. 9.

Reference numeral 100 denotes a semiconductor substrate, 101 a capacitor electrode, 102 a gate insulation layer having the multilayer structure, 104 a trench, and the radius of curvature a of the upper corner of the trench is set at 15 nm (a=15 mn), and the equivalent silicon oxide thickness $t_{ox}$ of the gate insulation layer 102 is set at 50 nm ($t_{ox}$=50 nm).

FIG. 4 shows the leakage current characteristic of the gate insulation layer 102 in the case where a DC bias voltage is applied to the capacitor shown in FIG. 3. In this case, the leakage current value is given by the gate area per 0.1 cm².

Figure 5:
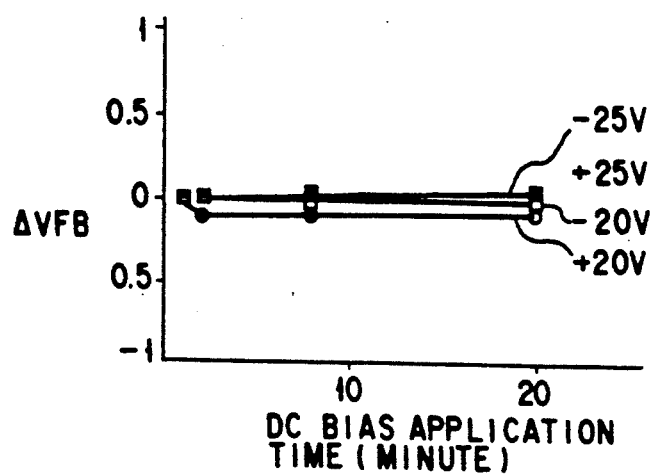
FIG. 5 is a characteristic showing a relationship between a DC bias application time of the capacitor and a variation in flat-band voltage VFB shown in FIG. 3.

FIG. 5 shows the relationship between the DC bias application time and the variation in the flat band voltage VFB (which corresponds to the variation in the threshold voltage of the MOSFET) in the case where the voltage, applied to the capacitor shown in FIG. 3, is +20 V or −20 V (equivalent to the dielectric breakdown electric field strength of 4 MV/cm), and in the case where the applied voltage is +25 V or −25 V (equivalent to the dielectric a breakdown electric field strength of 5 MV/cm).

As can be apparent from FIGS. 4 and 5, regardless of the fact that the leakage current of the gate insulation layer is 1 µA/cm² (0.1 µA/0.1 cm²) when the voltage of +20 V is applied across the gate insulation layer, and that the leakage current is 10 µA/cm² (1 µA/0.1 cm²) in the case of the applied voltage of 25 V. The variation in the flat band voltage VFB does not almost occur.

This is because a portion for causing the leakage current by the electric field concentration is limited to a part of the gate insulation layer located at the upper corner A of the trench.

That is, by setting the equivalent silicon oxide thickness $t_{ox}$ of the composite gate insulation layer, and the radius of curvature a of the upper corner A of the trench to certain values, the electric field concentrates at a portion of the composite gate insulation layer which is located at the upper corner of the trench, and the leakage current flows therethrough. Thus, an electric charge may be stored in the film interface of the composite gate insulation layer. However, since the interface of this portion is located away from the channel region which determines the threshold voltage of the MOSFET, the film interface is not almost affected by the storage of the electrical charge.

Because the voltage limit effect is provided by the composite gate insulation layer located at the upper corner of the trench, the variation of the flat band voltage VFB does not occur by limiting the voltage applied to the composite gate insulation layer to 5 MV/cm or less, whereby the threshold voltage of the MOSFET remains unchanged.

Further, since the gate breakdown occurs when the voltage applied across the gate insulation layer is 30 V (equivalent to a breakdown electric field strength of 6 MV/cm) or less, the electric field of 6 MV/cm or more is not applied to the other portion of the composite gate insulation layer located at the corner of the trench.

Consequently, the variation in the flat band voltage $V_{FB}$ can not occur, depending upon a function for suppressing the charge storage in the interface of the composite gate insulation layer.

Next, one example of methods for making the vertical MOSFET shown in FIGS. 1A to 2 will be briefly described.

An N-type epitaxial layer 11 having a thickness of about 10 μm is grown on a surface of a semiconductor substrate (wafer) of N+-type silicon having a thickness of 150 μm. A P-type impurity is diffused into the epitaxial layer 11 to provide a P-type semiconductor layer 12 having a thickness of about 2.5 μm. Thereafter, using lithography and ion implantation processes, an N+-type semiconductor layer 13 having a thickness of 0.5 μm is formed in the semiconductor layer 12.

Next, a CVD oxide film having 600 nm is deposited on the upper surface of the substrate. For example, by means of RIE (Reactive Ion Etching) techniques, a plurality of trenches 14 are provided in the semiconductor layer 13 so as to reach the epitaxial layer 11 through the semiconductor layer 12. In this case, since the trenches 14 are formed so as to provide a lattice-shaped plane pattern, the semiconductor layer 13 is separated to provide a plurality of unit cells arranged regularly and each having N+-type source region 13 and substantially a rectangular plane pattern.

After the removal of the CVD oxide film, a thermal oxide film 151, a nitride film 152, and a CVD (chemical vapor deposition) oxide film 153 are formed on the surface of the resultant structure in this order. A gate insulation layer 15 having a multilayer structure is then provided so as to cover the inner wall of the trench 14.

Thereafter, the polysilicon layer 16 doped with phosphorus is deposited so that the trenches 14 are completely filled. Since the polysilicon layer 16 is used as the gate electrode G, it is preferable to have a low resistance. For providing the doped polysilicon layer 16, a dopant impurity may be added to an undoped polysilicon layer.

The polysilicon film 16 is etched back such that the polysilicon layer for the gate electrode G remains in the trench 14.

An insulation layer 17 of PSG (phosph-silicate glass) having a thickness of 600 nm is deposited on the surface of the substrate by the CVD technique, and contact holes are formed in the insulation layer (above the gate electrode and the source regions 13). Thereafter, aluminum (Al) or aluminum/silicon alloy (Al·Si) is deposited over the surface the resultant structure to provide a gate wiring layer 18 and a source electrode S each having a thickness of 2 μm.

Further, a drain electrode D is provided on the opposite surface of the substrate, thereby obtaining a vertical MOSFET.

Figure 6:
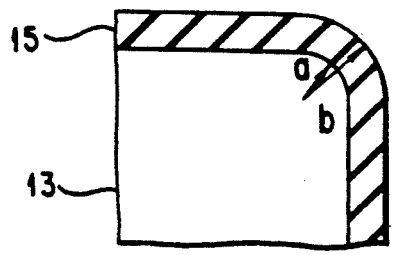
FIG. 6 is a cross-sectional view showing another example of the upper corner A of the trench in FIG. 2.
Figure 7:
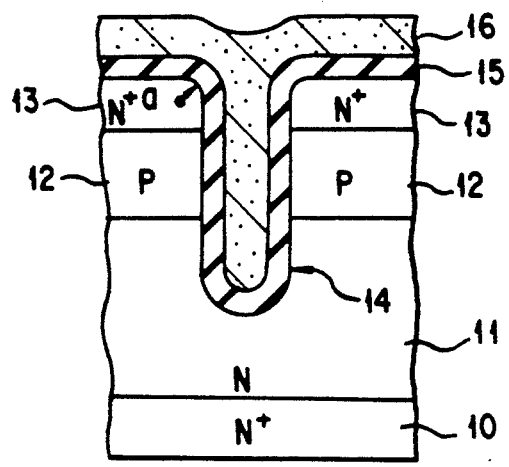
FIG. 7 is a cross-sectional view showing a trench portion of a conventional vertical MOSFET.
Figure 8:
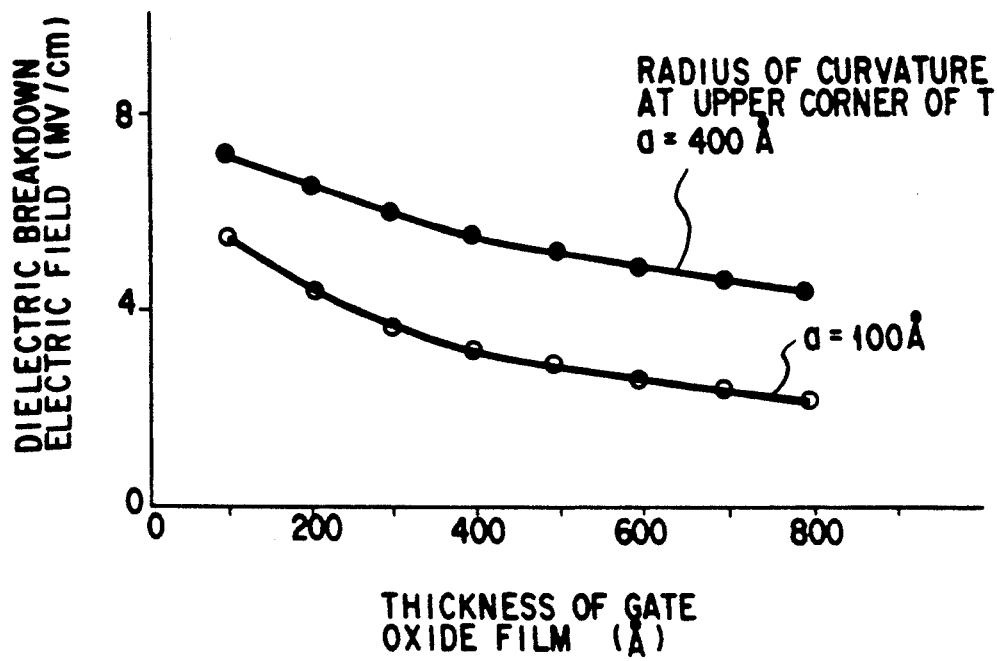
FIG. 8 is a graph showing a relationship between a trench capacitor breakdown electric field strength and a gate oxide film thickness in the case where a radius of curvature of an upper corner of the trench in FIG. 7 has different values.

FIG. 6 is another example of the upper corner A of the trench of the vertical MOSFET shown in FIG. 2.

FIG. 2 shows one example in which the composite gate insulation layer 15 has a bend capable of being approximated by concentric circles with respect to the upper corner A of the trench. On the other hand, FIG. 6 shows another example in which the composite gate insulation layer 15 has a bend whose configuration is not approximated by concentric circles with respect to the upper corner A of the trench.

In this case, the radius of curvature of the outer gate insulation film at the upper corner of the trench is represented by b. The equivalent silicon oxide thickness $t_{ox}$ is then expressed by (b−a). Therefore, when the intrinsic breakdown electric field strength Eo of the composite gate insulation layer is given by 8 MV/cm, the following relations are obtained.

$$1.4 \leq t_{ox}/a \leq 6.0$$

$$1.4 \leq (b-a)/a \leq 6.0$$

$$1.4 \leq (b/a) - 1 \leq 6.0$$

$$2.4 \leq (b/a) \leq 7.0$$

Consequently, Emax can be set to satisfy $2.5 \text{ MV/cm} \leq \text{Emax} \leq 5.0 \text{ MV/cm}$.

As described above, the electric field concentrates a part of the composite gate insulation layer located at the upper corner portion of the trench, thereby permitting the leakage current to flow through. Therefore, the electric charge is stored in the interface between films of the composite gate insulation layer. According to the present invention however, since the equivalent silicon oxide film thickness of the composite gate insulation layer and the radius of curvature of the upper corner of the trench are set to obtain predetermined values, unwanted variation in the threshold value of the gate due to the electric field applied thereto will not occur. Thus, the vertical MOSFET having the high reliability and stable characteristics can be achieved. Further, since the interface of films of the composite gate insulation layer located at the upper corner of the trench is spaced away from the channel region which determines the threshold voltage of the MOSFET, the electric charge stored in the interface will not be almost affected.

It is further understood by those skilled in the art that the foregoing description is only of the preferred embodiments and that various changes and modifications may be made in the invention without departing from the spirit and scope thereof.

What is claimed is:

1. A vertical MOS semiconductor device comprising:
   a semiconductor substrate of a first conductivity type including a first semiconductor layer of said first conductivity type;
   a second semiconductor layer of a second conductivity type formed in said first semiconductor layer to provide a channel;
   a third semiconductor layer of said first conductivity type formed in said second semiconductor layer;
   a trench formed in said third semiconductor layer so as to reach said first semiconductor layer;
   a gate insulating layer having a multilayer structure and covering a surface of said trench; and
   a gate electrode layer provided on said gate insulating layer so as to fill said trench therewith; wherein
   an equivalent silicon dioxide thickness of said gate insulating layer and a radius of curvature of an upper corner of said trench are provided so that a dielectric breakdown electric field strength of said gate insulating layer at said upper corner is in the range of 2.5 MV/cm to 5.0 MV/cm.

2. The vertical MOS semiconductor device according to claim 1, wherein said gate insulating layer is comprised of a first film of silicon dioxide, a second film of silicon nitride and a third film of silicon dioxide.

3. The vertical MOS semiconductor device according to claim 1, wherein said equivalent silicon dioxide thickness $t_{ox}$ of said gate insulating layer is given by $1.4 \leq t_{ox}/a \leq 6.0$ when said radius of curvature of said upper corner of said trench is given by a.

4. The vertical MOS semiconductor device according to claim 1, wherein a relationship between said radium of curvature a of said upper corner of said trench and a radium of curvature b of said insulating layer at said upper corner is given by $2.4 \leq b/a \leq 7.0$.

5. The vertical MOS semiconductor device according to claim 1, wherein a first ohmic contact serving as a drain electrode is provided on said semiconductor substrate.

6. The vertical MOS semiconductor device according to claim 1, wherein a second ohmic contact serving as a source electrode is provided on said third semiconductor layer so as to overlap said second semiconductor layer.

* * * * *

UNITED STATES PATENT AND TRADEMARK OFFICE
CERTIFICATE OF CORRECTION

PATENT NO. : 5,321,289
DATED : June 14, 1994
INVENTOR(S) : Yoshiro Baba, et. al.

It is certified that error appears in the above-indentified patent and that said Letters Patent is hereby corrected as shown below:

On the Title page, item [75], inventors: the third inventor's name, change "Noburo Matsuda" to --Noboru Matsuda--.

Column 9, line 2, claim 3, change "a" to --a--.

Signed and Sealed this

Eleventh Day of October, 1994

Attest:

BRUCE LEHMAN

*Attesting Officer*       *Commissioner of Patents and Trademarks*